United States Patent
Eva et al.

(10) Patent No.: US 11,495,275 B2
(45) Date of Patent: Nov. 8, 2022

(54) METHOD FOR MANAGING REQUESTS FOR ACCESS TO RANDOM ACCESS MEMORY AND CORRESPONDING SYSTEM

(71) Applicant: STMicroelectronics (Rousset) SAS, Rousset (FR)

(72) Inventors: Christophe Eva, Rousset (FR); Jean-Michel Gril-Maffre, Aix-en-Provence (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 17/336,841

(22) Filed: Jun. 2, 2021

(65) Prior Publication Data

US 2021/0390990 A1    Dec. 16, 2021

(30) Foreign Application Priority Data

Jun. 12, 2020 (FR) ...................................... 2006167

(51) Int. Cl.
| | |
|---|---|
| *G11C 7/22* | (2006.01) |
| *G06F 13/42* | (2006.01) |
| *G11C 7/10* | (2006.01) |
| *G11C 16/34* | (2006.01) |

(52) U.S. Cl.
CPC .......... *G11C 7/222* (2013.01); *G06F 13/4243* (2013.01); *G11C 7/1063* (2013.01); *G11C 7/1069* (2013.01); *G11C 7/1096* (2013.01); *G11C 16/3404* (2013.01)

(58) Field of Classification Search
CPC ..... G11C 7/222; G11C 7/1063; G11C 7/1069; G11C 7/1096; G11C 16/3404; G06F 13/4243
USPC .......................................................... 711/167
See application file for complete search history.

(56) References Cited

U.S. PATENT DOCUMENTS

| | | | |
|---|---|---|---|
| 6,356,987 B1 | 3/2002 | Aulas | |
| 8,285,908 B2 * | 10/2012 | Deogharia | G06F 13/4059 710/309 |
| 8,285,914 B1 * | 10/2012 | Venkatramani | G06F 13/1647 711/158 |
| 10,901,617 B2 * | 1/2021 | Mathews | G06F 3/0604 |

(Continued)

OTHER PUBLICATIONS

INPI Search Report and Written Opinion for FR 2006167 dated Dec. 6, 2020 (9 pages).

(Continued)

*Primary Examiner* — Son L Mai
(74) *Attorney, Agent, or Firm* — Crowe & Dunlevy (57) ABSTRACT

A random access memory is connected to a processing unit through a memory interface. Access to the random access memory is controlled by a process. The memory interface receives a request for access to the memory issued by the processing unit. In response to the request, the memory interface indicates to the processing unit that the memory is not available to receive another access request during a duration of unavailability. This duration can be differentiated depending on whether the received request is a write or read request. The value of the duration of unavailability associated with a write request and the value of the duration of unavailability associated with a read request are individually programmable independently of each other.

16 Claims, 3 Drawing Sheets

(56) References Cited

U.S. PATENT DOCUMENTS

2016/0335000 A1 11/2016 Pedersen et al.
2020/0050366 A1* 2/2020 Bavishi .............. G06F 12/0246

OTHER PUBLICATIONS

Sabnis A V et al: "1553B Communication Using DSP Based Digital Controller" Proceedings of the 2014 International Conference on Control Instrumentation Energy and Communication (CIEC) IEEE Jan. 31, 2014, pp. 485-489, Extracted on Nov. 14, 2014.

* cited by examiner

METHOD FOR MANAGING REQUESTS FOR ACCESS TO RANDOM ACCESS MEMORY AND CORRESPONDING SYSTEM

PRIORITY CLAIM

This application claims the priority benefit of French Application for Patent No. 2006167, filed on Jun. 12, 2020, the content of which is hereby incorporated by reference in its entirety to the maximum extent allowable by law.

TECHNICAL FIELD

Embodiments and implementations relate to the field of microelectronics and, more particularly, to the field of management of accesses to random access memories, for example of the Random Access Memory ("RAM") type, of the Dynamic Random Access Memory ("DRAM") type, or of the Static Random Access Memory ("SRAM") type.

BACKGROUND

Conventional electronic devices comprise, for example, a processor connected to a random access memory by means of bus and a memory interface. The processor can issue, via the buses and the memory interface, an access request intended to the read or write random access memory.

Typically, the performance of the random access memory decreases as the power supply voltage decreases, in particular due to increased read and write access times.

In order not to penalize the frequency performance of the processor, the memory interface implements a wait state mechanism allowing the interface to indicate to the processor that the random access memory is not available for a fixed number of clock cycles following after receiving the access request.

As a result, some operations performed by the processor last longer, which is penalizing in terms of consumption, most particularly in low voltage operating modes, intended to have lower consumption.

There is therefore a need to improve the low voltage performance of such electronic devices.

SUMMARY

It has been observed that an access time for writing content in the random access memory is less sensitive to variations in the memory power supply voltage than an access time for reading content and that consequently, in particular at low voltage, the access time to write content in the random access memory is shorter than the access time to read content.

According to one implementation and embodiment, it is therefore proposed to selectively adjust the waiting time between two access requests according to the reading or writing of content in the random access memory.

This allows, in particular, not forcing the processor to wait the same time to be able to perform an operation after a write request to the memory, as that to be able to perform an operation after a read request to the memory, when the memory would be indeed already available.

According to one aspect, provision is made of a method for managing access to a random access memory connected to a processing unit by means of a memory interface.

The method according to this aspect comprises, upon the memory interface receiving a request for access to the memory issued by the processing unit, an indication by the memory interface to the processing unit that the memory is not available to receive another access request during a duration of unavailability that can be differentiated depending on whether the received request is a write or read request.

Moreover, the value of the duration of unavailability associated with a write request and the value of the duration of unavailability associated with a read request are individually programmable independently of each other.

These programmable durations of unavailability are to be distinguished from the intrinsic durations of the write and/or read operations carried out internally by the memory itself.

These values of the duration of read and write unavailability are programmable, for example by a user of the microcontroller, independently of each other, for example depending on the features of the considered application, as the desired power supply voltage and the frequency of operation.

By virtue of this programming, for example by storing these values n registers, it is the user who chooses these values of durations of unavailability, independently of the intrinsic durations of the write and/or read operations carried out by the memory itself.

For example, the user can impose a non-zero number of clock cycle(s) (corresponding to the duration of unavailability) during which the memory will be considered as unavailable seen by the processing unit, which allows to guarantee that the write or read operation performed by the memory will be completed before receiving another access request and therefore guarantees a correct operation of the microcontroller, taking into account the considered frequency.

A duration of unavailability, for example write unavailability, programmed at a zero value means that it is considered that the intrinsic duration of the considered operation, for example the write operation, is compatible with a correct operation of the microcontroller taking into account the considered frequency.

Consequently, in this case, the user does not impose anything and leaves the memory and the memory interface to operate in the conventional manner.

As it has been observed that the access time to write content in the random access memory is shorter than the access time to read content, in particular at low voltage, the duration of unavailability associated with a write request can then be advantageously selected to be less than the duration of unavailability associated with a read request.

This then supports limiting the duration during which the processing unit cannot execute operations following a request for writing in the memory, which allows for lower consumption (fewer clock cycles during which the processing unit does not execute any operations) and a greater speed of execution of some operations.

Depending on the considered cases, these programmable values may both be non-zero, or else zero for one and non-zero for the other, or else both zero, for example if the intrinsic durations of the read and/or write operations, even increased, are not detrimental to the correct operation of the microcontroller, for example during a low voltage operation but also at low frequency.

Likewise, the duration of unavailability associated with a write request may, in some cases, be selected equal to the duration of unavailability associated with a read request, in particular in the absence of a "wait state".

According to one implementation, the processing unit is timed by a clock signal, and the value of the duration of unavailability associated with a write request as well as the value of the duration of unavailability associated with a read request may depend, as indicated above, on the power supply voltage value of the random access memory and the frequency of the clock signal.

Indeed, as indicated above, even if the access times to the memory increase with a drop in the power supply voltage, this may not be a problem if, for example, the timing frequency of the processing unit remains low. The user can then decide not to increase the duration of unavailability of the memory beyond the access time inherent to the low voltage memory.

According to one implementation, the value of the duration of unavailability associated with the read request is non-zero if the power supply voltage is less than a first threshold and if the frequency is greater than a second threshold, and the value of the duration of unavailability associated with the write request is non-zero if the power supply voltage is less than a third threshold and if the frequency is greater than a fourth threshold.

The first threshold and the third threshold may be the same or different.

However, in general the first threshold is greater than the third threshold.

For example, for a power supply voltage greater than 1 volt, the value of the duration of unavailability associated with the read request and the value of the duration of unavailability associated with the write request can both be selected to be zero, for a given frequency.

On the other hand, if the power supply voltage is comprised between 0.8 volts and 1 volt, the value of the duration of unavailability associated with a read request will be selected to be non-zero while the value of the duration of unavailability associated with a write request will always be zero, for example.

The value of the duration of unavailability associated with a read request and the value of the duration of unavailability associated with a write request can both be selected to be non-zero for a power supply voltage of less than 0.8 volts.

The second threshold and the fourth threshold may also be the same or different.

In general, a high desired frequency leads to non-zero duration of unavailability.

Thus, having individually customizable read or write thresholds to trigger a period of unavailability supports taking into account the differences in the evolution of read and write access times depending on the power supply voltage and the frequency.

As indicated previously, according to one implementation, when the processing unit is timed by a clock signal, the value of the duration of unavailability associated with a write request corresponds to a first number of cycles of the clock signal and the value of the duration of unavailability associated with a read request corresponds to a second number of cycles of the clock signal.

This allows for the use of counters to materialize these values of durations of unavailability.

According to another aspect, a system is proposed, comprising a random access memory connected to a processing unit by means of a memory interface.

Said memory interface includes a reception circuit configured to receive a request for access to the memory emitted by the processing unit, and a processing circuit connected to the reception circuit and configured to indicate to the processing unit that the random access memory is not available to receive another access request during a duration of unavailability that can be differentiated depending on whether the received request is a write or read request.

The system further comprises a programming circuit configured to individually program, independently of each other, the value of the duration of unavailability associated with a write request and the value of the duration of unavailability associated with a read request.

According to one embodiment, the processing unit is timed by a clock signal, and the value of the duration of unavailability associated with a write request as well as the value of the duration of unavailability associated with a read request depend on the power supply voltage value of the random access memory and the frequency of the clock signal.

According to one embodiment, the value of the duration of unavailability associated with a read request is non-zero if the power supply voltage is less than a first threshold and if the frequency is greater than a second threshold, and the value of the duration of unavailability associated with a write request is non-zero if the power supply voltage is less than a third threshold and if the frequency is greater than a fourth threshold.

According to one embodiment, the duration of unavailability associated with a write request is less than or equal to the duration of unavailability associated with a read request.

According to one embodiment, the processing unit is timed by a clock signal, the value of the duration of unavailability associated with a write request corresponds to a first number of cycles of the clock signal and the value of the duration of unavailability associated with a read request corresponds to a second number of cycles of the clock signal.

According to one embodiment, the processing circuit includes: a first counter timed by the clock signal and having a first end-of-count value corresponding to the value of the duration of unavailability associated with a write request; a second counter timed by the clock signal and having a second end-of-count value corresponding to the value of the duration of unavailability associated with a read request; and a state machine configured for triggering the first counter or the second counter if the first end-of-count value or the second end-of-count value is respectively non-zero, outputting a memory unavailability signal to the processing unit when one of the counters is triggered, and outputting a memory availability signal to the processing unit when the counter that has been triggered has reached its end-of-count value.

According to one embodiment, the programming circuit includes: a first programmable memory circuit connected to the processing circuit and intended to contain a first indication representative of the value of the duration of unavailability associated with a write request, and a second programmable memory circuit connected to the processing circuit and intended to contain a second indication representative of the value of the duration of unavailability associated with a read request.

According to one embodiment, said first indication is the first end-of-count value and said second indication is the second end-of-count value.

According to one embodiment, the system forms a microcontroller.

BRIEF DESCRIPTION OF THE DRAWINGS

Other advantages and features of the invention will become apparent upon examining the detailed description of embodiments and implementations, which are in no way limiting, and of the appended drawings wherein.

DETAILED DESCRIPTION

Figure 1:
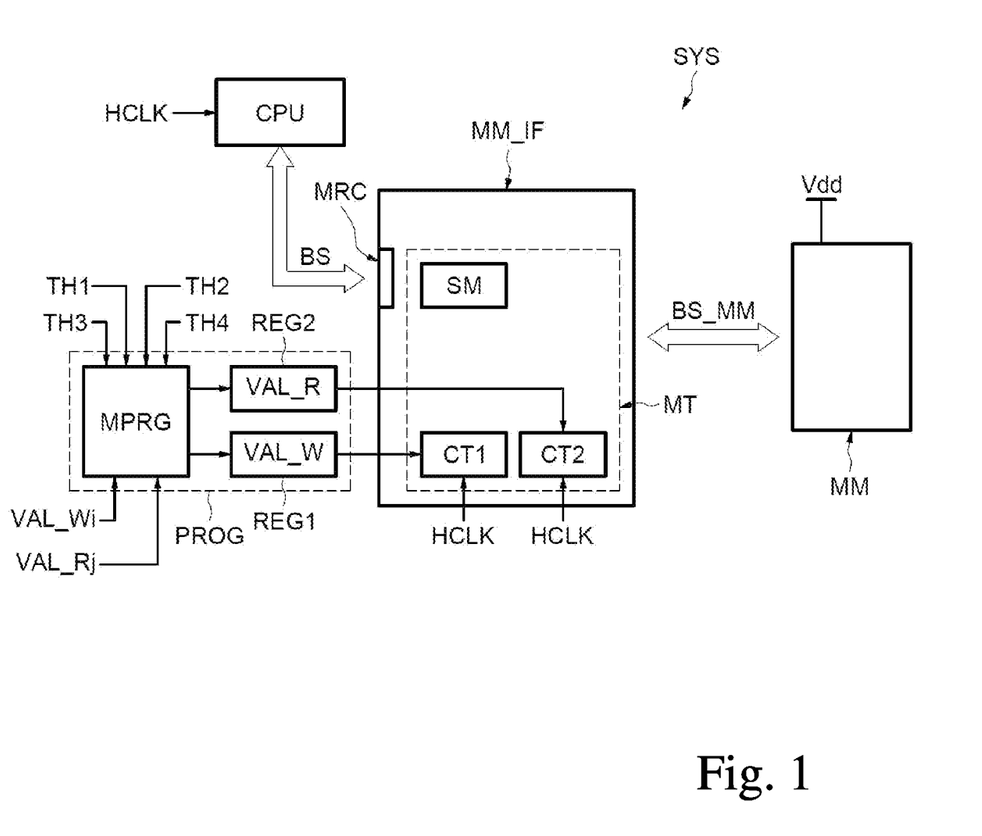
FIG. 1 illustrates a system comprising a random access memory.

FIG. 1 illustrates a system SYS comprising a random access memory MM, typically a static or dynamic random access memory, connected to a central processing unit CPU, for example a processor, by means of a memory interface MM_IF. The term "random access memory" is understood here in a general manner, in the sense that the random access memory MM may, for example, be composed of one or more random access memories. The random access memory MM is power supplied by a power supply voltage Vdd.

The processing unit CPU is timed by a clock signal HCLK having a frequency Freq.

The connection between the processing unit CPU and the memory interface MM_IF is made by a bus BS, for example of the "Advanced High-performance Bus" AHB type, or more generally by a bus corresponding to the "Advanced Microcontroller Bus Architecture" (AMBA) standard.

Likewise, the connection between the memory interface MM_IF and the random access memory MM is made by a memory bus BS_MM.

The system SYS thus formed can be, for example, a microcontroller integrated into a mobile apparatus such as a mobile telephone, for example a microcontroller of the STM32 range marketed by the company STMicroelectronics.

During the operation of the system SYS, the processing unit CPU issues read or write access requests RQT (FIG. 2) intended for the random access memory MM via the BS, BS_MM buses.

To this end, the memory interface MM_IF includes a reception circuit MRC configured to receive such an access request RQT.

In some applications, one typically seeks to minimize the power consumption of the system SYS and, in particular, it is advantageous to reduce the power consumption of the random access memory MM which is conventionally one of the most energy-intensive components in microelectronics.

Moreover, there are low consumption modes, wherein the power supply voltage Vdd of the memory is intentionally reduced.

However, decreasing the power supply voltage Vdd of the random access memory MM, has the consequence of increasing the read and write access times to the random access memory.

A problem can then arise when the random access memory MM processes a current access request RQT and a new access request is received while the memory has not yet finished writing or reading the data required by the current request.

The memory interface MM_IF therefore comprises a processing circuit MT configured to implement a "wait state" mechanism which indicates to the processing unit CPU that the random access memory MM is not available for a duration called duration of unavailability.

To this end, the processing circuit MT comprises a state machine SM capable of generating an availability signal HREADYout (FIG. 2) which is communicated to the processing unit CPU via the bus BS.

The availability signal HREADYout is, for example, a binary signal indicating in the high state that the memory MM is available, and in the low state that the memory MM is not available. When the availability signal HREADYout received by the processing unit CPU is in the low state, then the issuance of a new access request to the random access memory MM is inhibited.

Advantageously, the state machine SM supports an operation to selectively adjust a duration of unavailability of the random access memory MM depending on whether the access request RQT is a read or write access request.

The duration of unavailability associated with a read request is referenced VAL_R and the duration of unavailability associated with a write request is referenced VAL_W.

The durations of unavailability VAL_R and VAL_W can be the same or different and they are programmable, for example by the user of the system SYS.

The processing circuit MT includes a first counter CT1 and a second counter CT2 each timed by the clock signal HCLK of the processing unit CPU.

The first counter CT1 comprises an end-of-count value which corresponds to the duration of unavailability VAL_W. The second counter CT2 comprises an end-of-count value which corresponds to the duration of unavailability VAL_R.

As will be explained in more detail in relation to FIG. 2, following a write request, and assuming that VAL_W is not zero, the first counter CT1 is configured to increment at the rate of the clock signal HCLK, up to the value of the duration of write unavailability VAL_W.

Following a read request, and assuming that VAL_R is not zero, the second counter CT2 is configured to increment at the rate of the clock signal HCLK, up to the value of the duration of read unavailability VAL_R.

Moreover, the system SYS also comprises a programming circuit PROG comprising a programming control circuit MPRG in order to allow a user, as indicated above, to individually program the values of the duration of write VAL_W and read VAL_R unavailability.

The programming circuit PROG also comprises a first memory (or data storage) circuit REG1, for example a register, storing the value of the duration of write unavailability VAL_W, and a second memory (or data storage) circuit REG2, for example a register, storing the value of the duration of read unavailability VAL_R. The first and second memory circuits REG1, REG2, are respectively connected to the first and second counters CT1 and CT2 of the processing circuit MT.

The values of the duration of read VAL_R and write VAL_W unavailability are determined, for example, according to the frequency Freq of the processing unit CPU (i.e., the frequency of the clock signal HCLK) and the power supply voltage Vdd of the random access memory MM.

In order to determine the durations of unavailability, the user can, for example, define a set of first write end-of-count values VAL_Wi, and a set of second read end-of-count values VAL_Rj, depending on the ranges of values of power supply voltage Vdd of the random access memory MM and the frequencies Freq of the processing unit CPU.

In this regard, the user can, for example, use a first power supply voltage threshold TH1, a second frequency threshold TH2, a third power supply voltage threshold TH3 and a fourth frequency threshold TH4.

Of course, the number of thresholds may be different from four depending on the intended application.

Thus, for example, the value of the duration of unavailability associated with the read request may be non-zero if the power supply voltage Vdd is less than the first threshold TH1 and if the frequency Freq is greater than the second threshold TH2.

On the other hand, if the power supply voltage Vdd is less than the first threshold TH1 but the processing unit CPU works slowly, then the duration of unavailability associated with the read request can be zero, that is to say that wait state mechanism will not be used (no "wait state").

Likewise, the value of the duration of unavailability associated with the write request may be non-zero if the power supply voltage Vdd is less than the third threshold TH3, in practice less than the first threshold TH1, and if the frequency Freq is greater than the fourth threshold TH4.

If, on the other hand, the power supply voltage is greater than the third threshold TH3, then the duration of unavailability associated with the write request may be zero.

For example, for a power supply voltage Vdd less than or equal to 0.9 volts (TH1) and a working frequency less than 12 MHz (TH2), the durations of read VAL_R and write VAL_W unavailability are zero (no "wait state").

For a power supply voltage Vdd less than or equal to 0.9 volts (TH1) but greater than 0.7 volts (TH3) and a working frequency greater than 12 MHz (TH2), the duration of read unavailability VAL_R can be, for example, equal to two or three clock cycles HCLK and the duration of write unavailability VAL_W can remain zero (no "wait state").

For a power supply voltage less than or equal to 0.7 volts (TH3) and a working frequency greater than 12 MHz (TH2=TH4), the duration of read unavailability VAL_R can be, for example, equal to two or three clock cycles HCLK and the duration of write unavailability VAL_W can be equal to one clock cycle HCLK.

The user can therefore program the different threshold values THi as well as the different read VAL_Rj and write VAL_Wi end-of-count values taking into account these thresholds.

All the end-of-count values VAL_Rj, VAL_Wi as well as the values of the thresholds are stored in the memory circuits, for example registers.

The programming control circuit MPRG is then configured to select, depending on the power supply voltage Vdd of the memory MM and the frequency of the clock signal HCLK, the appropriate pair of end-of-count values VAL_Rj, VAL_Wi and to store them in the registers REG2 and RGEG1, respectively.

As indicated above, the contents of these two registers indicate the end-of-count values of the two counters CT1 and CT2.

The wait state mechanism is disabled in writing and/or reading when the value of the duration of unavailability VAL_W and/or VAL_R stored in the registers REG1, REG2 is zero, respectively.

The programming control circuit MPRG can select the appropriate pair of end-of-count values VAL_Wi, VAL_Rj, and store them in the registers REG1, REG2 respectively, for example at the initialization of the system, for example depending on the intended operating mode.

The programming control circuit MPRG can also be further configured to dynamically adapt the values of the durations of read VAL_R and or write VAL_W unavailability according to the current values of the power supply voltage Vdd and the frequency Freq.

Indeed, during the operation of the system SYS, if the power supply voltage Vdd and/or the frequency Freq exceeds one of the thresholds Thi (TH1, TH2, TH3, TH4) in one direction or another, for example when switching from a full consumption mode to a low consumption mode or vice versa, then the programming control circuit MPRG modifies the value(s) stored in the register(s) REG1, REG2, in order to correspond to the end-of-count values VAL_Wi, VAL_Rj, as programmed by the user for these new values of power supply voltage Vdd and frequency Freq.

Figure 2:
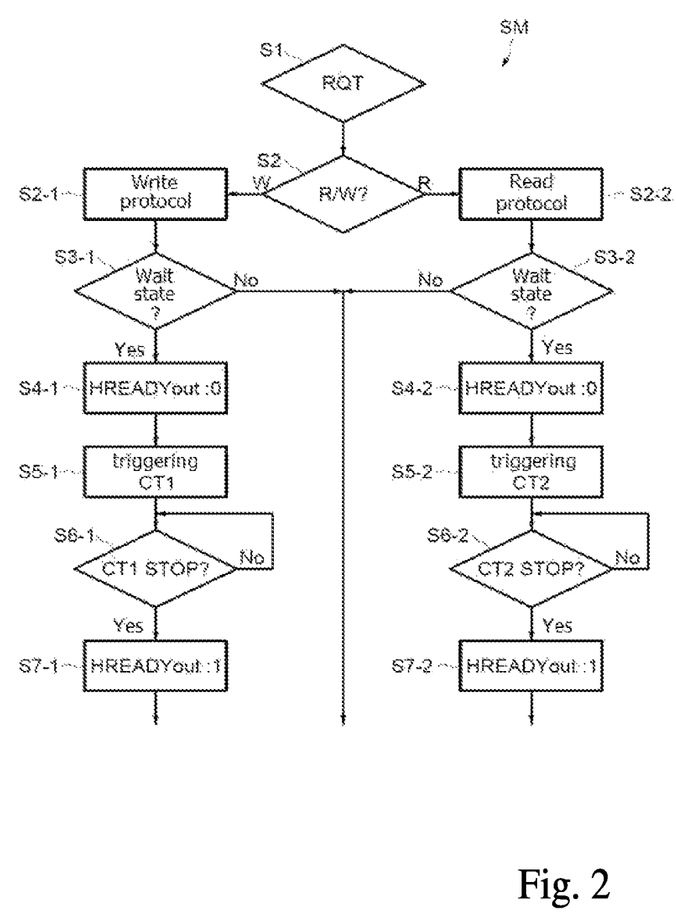
FIG. 2 illustrates a flowchart of an operation of a state machine.

FIG. 2 illustrates a flowchart of the operation of the state machine SM implemented in the memory interface MM_IF as shown with reference to FIG. 1.

Prior to step S1, the flowchart therefore comprises an initialization step, not shown, during which the programming circuit PROG determine, as indicated above, the value of the duration of unavailability VAL_W associated with a write request, and the value of the duration of unavailability VAL_R associated with a read request, and therefore the end-of-count value of the counters CT1 and CT2.

In step S1, the memory interface MM_IF indicates to the processing unit CPU that the random access memory MM is available because the availability signal HREADYout is in the high state.

The processing unit CPU emits an access request RQT via the bus BS to the random access memory MM, which is received by the memory interface MM_IF.

In the next step S2, the state machine SM determines whether the received access request RQT is intended to read or write content in the random access memory MM.

To determine whether the access request RQT is a read or write request, the state machine analyzes, for example, a signal HWRITE outputted on the bus BS (FIG. 3) indicating in the high state a write request and in the low state a read request.

Depending on the result determined in step S2, the next step is either step S2-1 if the access request RQT is a write request, or step S2-2 if the access request RQT is a read request.

From steps S2-1, S2-2, the flowchart is separated into two parallel branches, the first branch comprising steps dedicated to the management of a write request, and the second branch comprising steps dedicated to the management of a read request.

In the next step S2-1 or S2-2, the state machine SM transmits the access request RQT to the random access memory MM, via the memory bus BS_MM, by applying the conventional write or read protocol.

Figure 3:
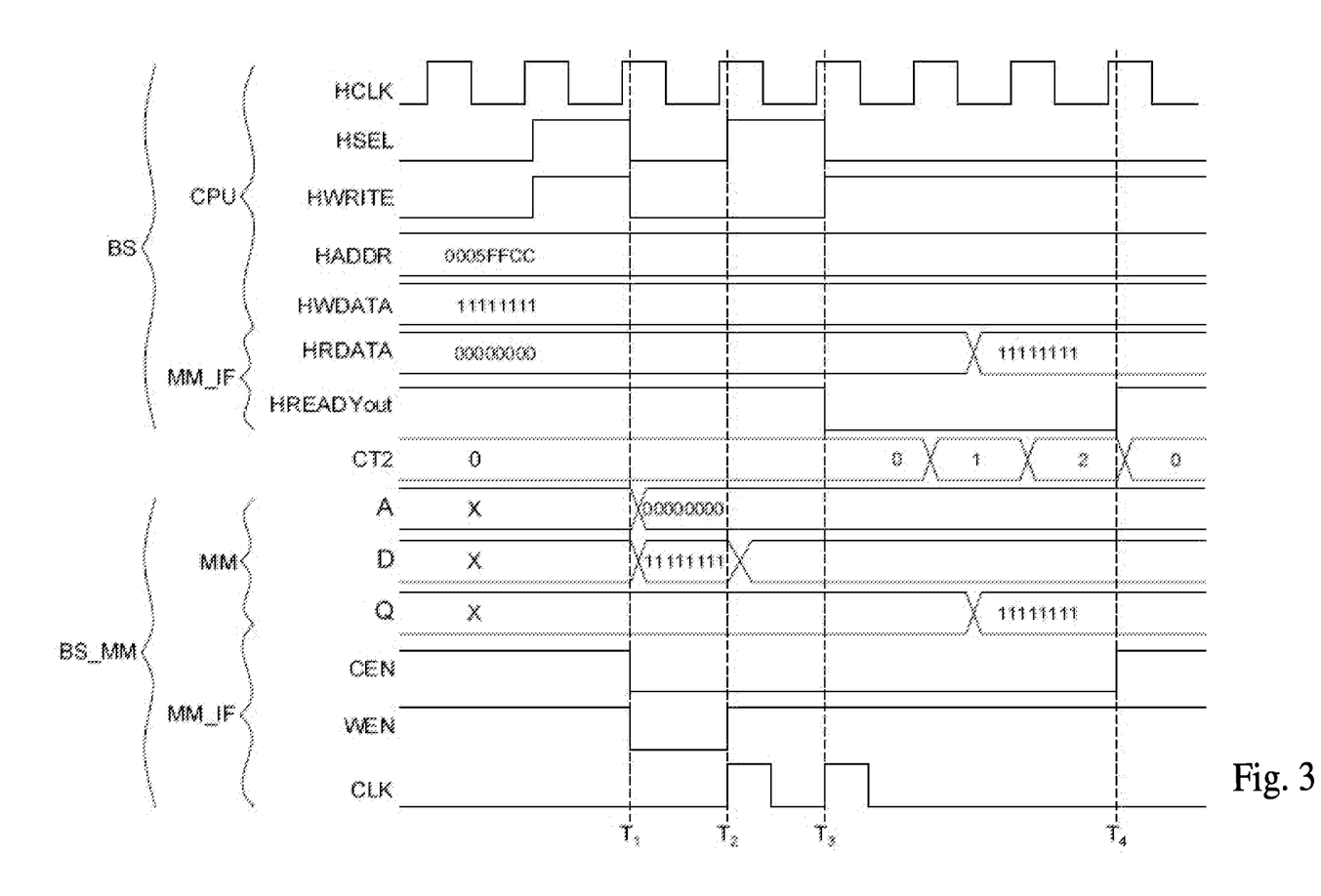
FIG. 3 illustrates an example of a timing diagram of the operation of the system as shown with reference to FIG. 1.

More specifically as illustrated in the timing diagram of FIG. 3, the write protocol includes transitions on the conventional and known CEN ("chip enable"), WEN ("write enable") signals, as well as the sending of the data to be written and its address.

Likewise, the reading protocol includes transitions on the conventional and known CEN ("chip enable"), WEN ("write enable") signals, as well as the sending of the address of the data to be read.

In the next step S3-1 or S3-2, the duration of unavailability value (end-of-count value) is compared to the zero value.

If the value of the duration of unavailability is zero, the random access memory MM then processes the write and/or read access requests RQT in a conventional manner, that is to say without implementing a wait state mechanism. The signal HREADYout can, for example, remain in the high state for a new request.

On the other hand, if the value of the duration of read or write unavailability is not zero then in the corresponding step S4-1 or S4-2, the processing circuit MT indicates to the processing unit CPU that the random access memory MM is not available by switching the availability signal HREADYout to the low state.

In step S5-1, or respectively S5-2, the state machine SM triggers either the first counter CT1 if the request RQT is a write request, or the second counter CT2 if the request RQT is a write request, so that only the concerned counter is incremented.

Step S6-1 or S6-2 corresponds to testing the incremention of the concerned counter, CT1 or CT2, at each cycle of the clock signal HCLK up to the end-of-count value.

In step S7-1 or S7-2, the duration of unavailability has finally expired, and the random access memory MM can process a new access request from the processing unit CPU.

The processing circuit MT again indicates that the random access memory MM is available by raising the availability signal HREADYout to the high state.

FIG. 3 illustrates an example of a timing diagram of the operation of the system SYS as shown with reference to FIG. 1.

The timing diagram illustrates a management by the system SYS of a data write access request, for example the data 11111111 at the address 0005FFCC (these two values being in hexadecimal), immediately followed by a management of a data read access request, for example the data previously written at this same address. Signals relating to the management of requests are therefore transmitted throughout the system SYS on the bus BS and the memory bus BS_MM. The signals flowing on the buses BS and BS_MM are timed by the clock signal HCLK.

On the bus BS, signals emitted by the processing unit CPU comprise: a selection signal HSEL to activate the random access memory MM; a signal characterizing the read or write request HWRITE; and an address information HADDR designating an address in the random access memory MM to be read or written.

Moreover, as part of a write request, a data HWDATA to be written in the random access memory MM is transmitted by the processing unit CPU to the memory interface MM_IF on the bus BS.

Still on the bus BS, the signals emitted by the memory interface MM_IF comprise: the availability signal HREADYout indicating the availability or non-availability of the random access memory MM; and as part of a read request, a data HRDATA read in the memory transmitted by the memory interface MM_IF to the processing unit CPU.

On the memory bus BS_MM, data emitted or received by the random access memory MM comprise: an address A corresponding to the address information HADDR; an input data D to be written in the memory corresponding to the data to be written HWDATA; and an output data Q read in the memory corresponding to the read data HRDATA returned to the processing unit CPU.

Still on the memory bus BS_MM, signals generated by the memory interface MM_IF to the random access memory MM comprise: the chip enable CEN signal; the signal characterizing the reading or writing WEN; and a memory clock signal CLK generated from the clock signal HCLK. The method of irregular generation of the memory clock signal CLK is obtained by a method called pulse skipping method supporting a limitation of power consumption by reducing the number of clock cycles affecting the state of random access memory MM.

Finally, the current value of the counter CT2 is shown on the timing diagram. For the sake of simplification, only the current value of the second counter CT2 associated with a reading is shown. Indeed, in the example illustrated, only the management of the read access request implements the wait state mechanism. The end-of-count value of the first counter CT1 is here zero.

The timing diagram firstly represents the emission by the processing unit CPU of a write access request in the random access memory MM of the data HWDATA at the address HADDR.

The write access request is characterized by the generation by the processing unit CPU of a high state of the selection signal HSEL and by a high state of the signal HWRITE.

The memory interface MM_IF consequently generates, at an instant T1, a low state of the chip enable CEN signal and a low state of the WEN signal. These two signals are received by the random access memory MM and initiate writing.

The random access memory MM then processes the write access request, between time T1 and time T2, the input data D takes the value of the data to be written HWDATA which is written at the address A representative of the address information HADDR.

The write access request is processed by the system SYS, in this example, in a single cycle of clock signal HCLK without using any wait cycles resulting from the wait state mechanism.

The availability signal HREADYout is maintained in the high state during the entire data writing to indicate to the processing unit CPU that the random access memory MM is available at the next clock signal HCLK cycle.

The read access request can therefore be processed immediately in the next clock signal HCLK cycle.

In this regard, the processing unit CPU issues an access request for reading the content of the random access memory MM stored in the address HADDR.

The read access request is characterized by the generation by the processing unit CPU of a high state of the selection signal HSEL and by a low state of the signal HWRITE.

The memory interface MM_IF transmits, at an instant T3, the read access request by generating a low state of the chip enable CEN signal and a high state of the WEN signal. These two signals are received by the random access memory MM, which initiates the reading process on the next rising edge of the signal CLK and the availability signal HREADYout switches to the low state, from the instant T3 until an instant T4.

The counter CT2 is triggered and its current value is incremented up to the end-of-count value programmed by the user, here the value 2, corresponding to three clock cycles.

The duration of unavailability associated with the read request is therefore here three clock signal HCLK cycles.

Consequently, the availability signal HREADYout is maintained in the low state during the three clock cycles of the duration of unavailability. The emission of a new access request by the processing unit CPU is then inhibited during these three clock cycles.

During this time, the random access memory MM processes the read access request and returns the data Q to the memory interface MM_IF which transmits the read data HRDATA to the processing unit.

The invention claimed is:

1. A method for managing access to a random access memory connected to a processing unit through a memory interface, comprising:
   in response to receiving a request issued by the processing unit at the memory interface for access to the memory, sending an indication by the memory interface to the processing unit that the memory is not available to receive another access request during a duration of unavailability;

wherein said duration of unavailability is differentiated depending on whether the received request is a write or read request; and wherein a value of the duration of unavailability associated with a write request and a value of the duration of unavailability associated with a read request are individually programmable independently of each other.

2. The method according to claim 1, further comprising: timing the processing unit by a clock signal;

wherein the value of the duration of unavailability associated with the write request and the value of the duration of unavailability associated with the read request are each dependent on a value of a power supply voltage for the random access memory and a frequency of the clock signal.

3. The method according to claim 2, wherein the value of the duration of unavailability associated with the read request is non-zero if the power supply voltage is less than a first threshold and if the frequency is greater than a second threshold.

4. The method according to claim 2, wherein the value of the duration of unavailability associated with the write request is non-zero if the power supply voltage is less than a third threshold and if the frequency is greater than a fourth threshold.

5. The method according to claim 1, wherein the value duration of unavailability associated with the write request is less than or equal to the value of duration of unavailability associated with the read request.

6. The method according to claim 1, further comprising: timing the processing unit by a clock signal;

wherein the value of the duration of unavailability associated with the write request corresponds to a first number of cycles of the clock signal; and wherein the value of the duration of unavailability associated with the read request corresponds to a second number of cycles of the clock signal.

7. A system, comprising:

a random access memory;

a processing unit connected to the random access memory through a memory interface;

wherein said memory interface includes:

a reception circuit configured to receive a request for access to the memory emitted by the processing unit; and a processing circuit connected to the reception circuit and configured to indicate to the processing unit that the random access memory is not available to receive another access request during a duration of unavailability, wherein said duration of unavailability is differentiated depending on whether the received request is a write or read request; and a programming circuit configured to individually program, independently of each other, a value of the duration of unavailability associated with the write request and a value of the duration of unavailability associated with a read request.

8. The system according to claim 7, wherein the processing unit is timed by a clock signal, and wherein the value of the duration of unavailability associated with the write request and the value of the duration of unavailability associated with the read request each depend on the power supply voltage value of the random access memory and the frequency of the clock signal.

9. The system according to claim 8, wherein the value of the duration of unavailability associated with the read request is non-zero if the power supply voltage is less than a first threshold and if the frequency is greater than a second threshold.

10. The system according to claim 8, wherein the value of the duration of unavailability associated with the write request is non-zero if the power supply voltage is less than a third threshold and if the frequency is greater than a fourth threshold.

11. The system according to claim 7, wherein the value of the duration of unavailability associated with the write request is less than or equal to the value of the duration of unavailability associated with the read request.

12. The system according to claim 7, wherein the processing unit is timed by a clock signal, and wherein the value of the duration of unavailability associated with the write request corresponds to a first number of cycles of the clock signal; and wherein the value of the duration of unavailability associated with the read request corresponds to a second number of cycles of the clock signal.

13. The system according to claim 12, wherein the processing circuit comprises:

a first counter timed by the clock signal and having a first end-of-count value corresponding to the value of the duration of unavailability associated with the write request;

a second counter timed by the clock signal and having a second end-of-count value corresponding to the value of the duration of unavailability associated with the read request; and a state machine configured to: trigger the first counter if the first end-of-count value is non-zero or trigger the second counter if the second end-of-count value is non-zero, output a memory unavailability signal to the processing unit when one of the first and second counters is triggered and output a memory availability signal to the processing unit when said one of the first and second counters that has been triggered has reached an end-of-count value.

14. The system according to claim 13, wherein the programming circuit comprises:

a first programmable memory circuit connected to the processing circuit and configured to store a first indication representative of a value of the duration of unavailability associated with the write request; and a second programmable memory circuit connected to the processing circuit and configured to store a second indication representative of a value of the duration of unavailability associated with the read request.

15. The system according to claim 14, wherein said first indication is the first end-of-count value and said second indication is the second end-of-count value.

16. The system according to claim 7, forming a microcontroller.

* * * * *